United States Patent
Yin et al.

(10) Patent No.: US 11,111,575 B2
(45) Date of Patent: Sep. 7, 2021

(54) PVD VACUUM PLATING PROCESS FOR ALUMINUM ALLOY SURFACE

(71) Applicant: Foshan Nanhai Jingdingtai Intelligent Technology Co., Ltd, Foshan (CN)

(72) Inventors: Zhongle Yin, Foshan (CN); Wenqiang Zhao, Foshan (CN)

(73) Assignee: Foshan Nanhai Jingdingtai Intelligent Technology Co., Ltd, Foshan (CN)

( * ) Notice: Subject to any disclaimer, the term of this patent is extended or adjusted under 35 U.S.C. 154(b) by 41 days.

(21) Appl. No.: 16/724,742

(22) Filed: Dec. 23, 2019

(65) Prior Publication Data

US 2020/0240003 A1    Jul. 30, 2020

(30) Foreign Application Priority Data

Jan. 27, 2019  (CN) .......................... 201910077064.4

(51) Int. Cl.
*C23C 14/34* (2006.01)
*C23C 14/06* (2006.01)
*C23C 14/10* (2006.01)

(52) U.S. Cl.
CPC .......... *C23C 14/34* (2013.01); *C23C 14/0641* (2013.01); *C23C 14/10* (2013.01)

(58) Field of Classification Search
CPC ... C23C 14/022; C23C 14/0641; C23C 14/10; C23C 14/325; C23C 14/34; C23C 28/04; C23C 28/048
USPC .......................... 204/192.26–192.28, 192.38
See application file for complete search history.

(56) References Cited

U.S. PATENT DOCUMENTS

| | | | | |
|---|---|---|---|---|
| 8,507,085 | B2 * | 8/2013 | Chang | ................. C23C 14/0015 428/336 |
| 8,697,249 | B1 * | 4/2014 | Zhang | ..................... C23C 28/34 428/627 |
| 2014/0242413 | A1 * | 8/2014 | Ribeiro | ................... C23C 28/36 428/624 |
| 2014/0254072 | A1 * | 9/2014 | Zhang | ..................... G06F 1/181 361/679.01 |

* cited by examiner

*Primary Examiner* — Rodney G McDonald
(74) *Attorney, Agent, or Firm* — Wood Herron & Evans LLP

(57) ABSTRACT

A PVD vacuum plating process for an aluminum alloy surface is provided. The process includes forming a bottom layer: bombarding with an arc power supply, with a bias voltage being controlled at 200-300 V, and the time being controlled at 3-5 minutes; forming an intermediate multi-layer: conducting multilayer transition with an oxide and a nitride, with the number of layers being controlled at 8-10, the time for an individual layer being controlled at 10-20 minutes, and a target current being controlled at 10-20 A. The process also includes forming a transitional engagement layer: conducting mixed sputtering of a transition layer and a color layer for the time of 15-25 minutes; forming the color layer: controlling the time for the color layer at 20-30 minutes; and forming a protective layer: using a high-frequency and large-energy power supply with the time controlled at 40-50 minutes, the process thereby eliminating water plating steps.

5 Claims, No Drawings

PVD VACUUM PLATING PROCESS FOR ALUMINUM ALLOY SURFACE

CROSS-REFERENCE TO RELATED APPLICATION

This application claims priority to Chinese Application No. 201910077064.4, filed Jan. 27, 2019, with the same title as listed above. The above-mentioned patent application is incorporated herein by reference in its entirety.

TECHNICAL FIELD

The present invention relates to the field of Physical Vapor Deposition ("PVD") vacuum plating, and in particular, to a PVD vacuum plating process applied to an aluminum alloy surface.

BACKGROUND

Currently, aluminum alloy is applied widely in various technical fields, such as traditional hardware pendants, automobile logos, and sanitary wares. Especially in recent years, in fields such as electronic products and mobile phone shells, aluminum alloy has achieved colorful and gorgeous effects by adopting an anodizing treatment method.

However, one problem with use of aluminum alloy is that the drawback of some conventional treatment means such as the anodizing and water electroplating is that the pollution to the environment is very serious. Thus, it is desirable to provide a PVD vacuum plating process for an aluminum alloy surface that addresses this and other deficiencies in the known art, e.g., by eliminating a need for water electroplating.

SUMMARY

In order to achieve the above objective, one embodiment of the present invention provides a PVD vacuum plating process for an aluminum alloy surface. The process includes: (step 1) forming a bottom layer: bombarding with an arc power supply, with a bias voltage being controlled at 200-300 V, and the time being controlled at 3-5 minutes; (step 2) forming an intermediate multi-layer: conducting multilayer transition with an oxide and a nitride, with the number of layers being controlled at 8-10, the time for an individual layer being controlled at 10-20 minutes, and a target current being controlled at 10-20 A; (step 3) forming a transitional engagement layer: conducting mixed sputtering of a transition layer and a color layer for the time of 15-25 minutes; (step 4) forming the color layer: controlling the time for the color layer at 20-30 minutes; and (step 5) forming a protective layer: using a high-frequency and large-energy power supply with the time controlled at 40-50 minutes, so as to obtain a PVD film layer.

In some embodiments, for the intermediate multi-layer, the oxide is $SiO_2$; and the nitride is TiN.

In another embodiment, the high-frequency and large-energy power supply for the protective layer is in a range of 70-90 kHz, and at a range of 20-30 kW.

In a further embodiment, the PVD film layer has a thickness of 1.5-2.5 μm. These embodiments may be combined in any combination and sub-combination to achieve the desired technical effects.

To this end, the embodiments of the present invention achieve the following technical benefits and effects. The process includes the steps of forming each of the bottom layer, the intermediate multi-layer, the transitional engagement layer, the color layer, and the protective layer. After being treated with this process, the aluminum alloy can still meet performance requirements of the film layer such as corrosion resistance without necessitating the alloy being subjected to water plating treatment and also, the thickness of the film layer is greatly reduced. As compared with a traditional process, the present invention has the following advantages: under the premise of eliminating the water plating, when only the PVD plating is used, various test effects such as corrosion resistance and friction resistance are also achieved; and meanwhile, the production cost is reduced and the yield loss is reduced.

DETAILED DESCRIPTION

The following clearly and completely describes the technical solutions in the embodiments of the present invention. To make objectives, features, and advantages of the present invention clearer, the following describes embodiments of the present invention in more detail with reference to specific implementations.

Example 1

A bottom layer is formed as follows: bombardment was conducted with an arc power supply, with a bias voltage being controlled at 200 V, and the time being controlled at 3 minutes. An intermediate multi-layer is formed as follows: multilayer transition was conducted with an oxide (such as $SiO_2$) and a nitride (such as TiN), with the number of layers being controlled at 8, the time for an individual layer being controlled at 10 minutes, and a target current being controlled at 10 A. A transitional engagement layer is formed as follows: mixed sputtering of a transition layer and a color layer was conducted for the time of 15 minutes. A color layer is formed as follows: the time for the color layer was controlled at 20 minutes. A protective layer is formed as follows: a high-frequency and large-energy power supply (70 kHz, 20 kW) was used with the time controlled at 40 minutes.

Example 2

A bottom layer is formed as follows: bombardment was conducted with an arc power supply, with a bias voltage being controlled at 250 V, and the time being controlled at 4 minutes. An intermediate multi-layer is formed as follows: multilayer transition was conducted with an oxide (such as $SiO_2$) and a nitride (such as TiN), with the number of layers being controlled at 9, the time for an individual layer being controlled at 15 minutes, and a target current being controlled at 15 A. A transitional engagement layer is formed as follows: mixed sputtering of a transition layer and a color layer was conducted for the time of 20 minutes. A color layer is formed as follows: the time for the color layer was controlled at 25 minutes. A protective layer is formed as follows: a high-frequency and large-energy power supply (80 kHz, 25 kW) was used with the time controlled at 45 minutes.

Example 3

A bottom layer is formed as follows: bombardment was conducted with an arc power supply, with a bias voltage being controlled at 300 V, and the time being controlled at 5 minutes. An intermediate multi-layer is formed as follows:

multilayer transition was conducted with an oxide (such as SiO$_2$) and a nitride (such as TiN), with the number of layers being controlled at 10, the time for an individual layer being controlled at 20 minutes, and a target current being controlled at 20 A. A transitional engagement layer is formed as follows: mixed sputtering of a transition layer and a color layer was conducted for the time of 25 minutes. A color layer is formed as follows: the time for the color layer was controlled at 30 minutes. A protective layer is formed as follows: a high-frequency and large-energy power supply (90 kHz, 30 kW) was used with the time controlled at 50 minutes.

Performance Test

The aluminum alloy metal parts of these examples were tested by subjecting same to each of a salt spray corrosion resistance test, an abrasion resistance test, a solar radiation resistance test, as well as a drop test and a thermal cycle test, and the following results were obtained.

TABLE 1

Performance test results of this example

| Test Items | Example 1 | Example 2 | Example 3 | Judgment Criterion |
|---|---|---|---|---|
| Salt Spray Test | OK | OK | OK | Qualified if passing through a neutral salt spray for 48 hours |
| Vibration Abrasion Test | OK | OK | OK | Tested in a German Rosler vibration abrasion tester for 2 hours |
| Solar Radiation | OK | OK | OK | Aging Test for 3 Cycles |
| Drop Test | OK | OK | OK | Test Criterion for Mobile Phone Components |
| Thermal Cycle Test | OK | OK | OK | Test Criterion for Mobile Phone Components |

The aforementioned test data shows that the aluminum alloy product of this invention met the requirements of industry standards in the respective tests, and after eliminating the water plating, the aforementioned process solves the environmental protection concerns, while simplifying the production procedures and reducing the yield loss.

The embodiments described above are only descriptions of preferred embodiments of the present invention, and are not intended to limit the scope of the present invention. Various variations and modifications can be made to the technical solution of the present invention by those of ordinary skills in the art, without departing from the design of the present invention. The variations and modifications should all fall within the claimed scope defined by the claims of the present invention.

What is claimed is:

1. A PVD vacuum plating process for an aluminum alloy surface, comprising:
   forming a bottom layer by utilizing an arc power supply, with a bias voltage being controlled at 200-300 V, and a time being controlled at 3-5 minutes;
   forming an intermediate multi-layer with an oxide and a nitride, with a number of layers being controlled at 8-10, a time for forming an individual layer being controlled at 10-20 minutes, and a target current being controlled at 10-20 A;
   forming a transitional engagement layer by conducting mixed sputtering of a transition layer and a color layer for a time of 15-25 minutes;
   forming a layer consisting of the color layer by controlling a time for forming the layer consisting of the color layer at 20-30 minutes; and
   forming a protective layer by using a power supply with a time controlled at 40-50 minutes, so as to obtain a PVD layer as the protective layer.

2. The PVD vacuum plating process of claim 1, wherein for the intermediate multi-layer, the oxide is SiO$_2$; and the nitride is TiN.

3. The PVD vacuum plating process of claim 1, wherein the power supply for the protective layer is in a range of 70-90 kHz, and at a range of 20-30 kW.

4. The PVD vacuum plating process of claim 1, wherein the PVD layer has a thickness of 1.5-2.5 µm.

5. The PVD vacuum plating process of claim 2, wherein the power supply for the protective layer is in a range of 70-90 kHz, and at a range of 20-30 kW, and wherein the PVD layer has a thickness of 1.5-2.5 µm.

* * * * *